(12) United States Patent
Addepalli et al.

(10) Patent No.: US 9,252,302 B2
(45) Date of Patent: Feb. 2, 2016

(54) PHOTOVOLTAIC BACK CONTACT

(71) Applicants: Pratima V. Addepalli, Monroe, MI (US); John S. Deeken, Toledo, OH (US); Oleh Petro Karpenko, Richmond, CA (US)

(72) Inventors: Pratima V. Addepalli, Monroe, MI (US); John S. Deeken, Toledo, OH (US); Oleh Petro Karpenko, Richmond, CA (US)

(73) Assignee: First Solar, Inc., Perrysburg, OH (US)

( * ) Notice: Subject to any disclaimer, the term of this patent is extended or adjusted under 35 U.S.C. 154(b) by 183 days.

(21) Appl. No.: 14/072,237

(22) Filed: Nov. 5, 2013

(65) Prior Publication Data

US 2014/0057389 A1    Feb. 27, 2014

Related U.S. Application Data

(62) Division of application No. 12/879,895, filed on Sep. 10, 2010, now Pat. No. 8,603,253.

(60) Provisional application No. 61/241,606, filed on Sep. 11, 2009.

(51) Int. Cl.

| | |
|---|---|
| *H01L 31/0224* | (2006.01) |
| *C11D 3/20* | (2006.01) |
| *C11D 3/30* | (2006.01) |
| *C11D 7/26* | (2006.01) |
| *C11D 7/32* | (2006.01) |
| *C11D 11/00* | (2006.01) |
| *H01L 31/073* | (2012.01) |
| *H01L 31/18* | (2006.01) |

(52) U.S. Cl.
CPC ...... *H01L 31/022441* (2013.01); *C11D 3/2075* (2013.01); *C11D 3/30* (2013.01); *C11D 7/265* (2013.01); *C11D 7/3209* (2013.01); *C11D 7/3218* (2013.01); *C11D 11/0047* (2013.01); *H01L 31/073* (2013.01); *H01L 31/18* (2013.01); *H01L 31/1828* (2013.01); *Y02E 10/543* (2013.01)

(58) Field of Classification Search
CPC . H01L 21/385; H01L 31/073; C11D 11/0047
See application file for complete search history.

(56) References Cited

U.S. PATENT DOCUMENTS

| | | | |
|---|---|---|---|
| 5,837,662 A | 11/1998 | Chai et al. | |
| 6,585,825 B1 | 7/2003 | Skee | |
| 7,671,001 B2 | 3/2010 | Skee | |
| 8,309,387 B2 * | 11/2012 | Forehand | H01L 31/073 136/256 |
| 2004/0018664 A1 | 1/2004 | Guha | |
| 2006/0175295 A1 | 8/2006 | Chu et al. | |
| 2006/0183055 A1 | 8/2006 | O'Neill et al. | |
| 2007/0060490 A1 | 3/2007 | Skee | |
| 2007/0148336 A1 | 6/2007 | Bachrach et al. | |
| 2008/0251119 A1 * | 10/2008 | Forehand | H01L 31/073 136/255 |
| 2009/0020149 A1 * | 1/2009 | Woods | H01L 21/385 136/244 |
| 2009/0107520 A1 | 4/2009 | Lee et al. | |
| 2010/0167535 A1 | 7/2010 | Nishiwaki et al. | |
| 2010/0261632 A1 | 10/2010 | Korenski et al. | |
| 2011/0005591 A1 | 1/2011 | Buller et al. | |
| 2011/0030776 A1 | 2/2011 | Buller et al. | |
| 2012/0088189 A1 | 4/2012 | Miyagishima et al. | |
| 2012/0192948 A1 | 8/2012 | Basol | |
| 2013/0000214 A1 | 1/2013 | Chu et al. | |

FOREIGN PATENT DOCUMENTS

CN           101335310 A       12/2008

* cited by examiner

*Primary Examiner* — Gregory Webb
(74) *Attorney, Agent, or Firm* — Dickstein Shapiro LLP

(57) ABSTRACT

A method to preparing Cadmium telluride surface before forming metal back contact is disclosed. The method can include removing carbon from Cadmium telluride surface.

21 Claims, 3 Drawing Sheets

PHOTOVOLTAIC BACK CONTACT

CLAIM OF PRIORITY

This application is a divisional of U.S. patent application Ser. No. 12/879,895, filed Sep. 10, 2010, which claims priority under 35 U.S.C. §119(e) to Provisional U.S. Patent Application Ser. No. 60/241,606 filed on Sep. 11, 2009, the entireties of each of which is are hereby incorporated by reference herein.

TECHNICAL FIELD

This invention relates to a method of preparing a surface before forming metal back contact for solar modules.

BACKGROUND

In order to create electrical contact to a surface of a photovoltaic device, the back contact layer can include metal.

DETAILED DESCRIPTION

Figure 1:
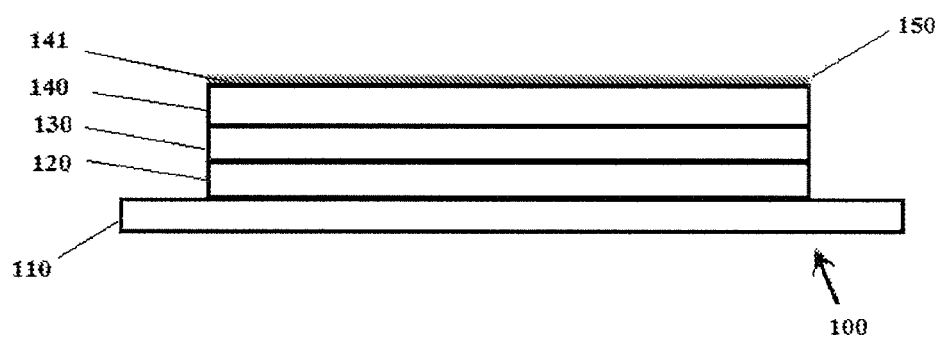
FIG. 1 is a schematic of a photovoltaic device having multiple layers before preparing cadmium telluride surface.

Photovoltaic modules, devices, or cells, can include multiple layers (or coatings) created on a substrate (or superstrate). For example, a photovoltaic device can include a barrier layer, a transparent conductive oxide (TCO) layer, a buffer layer, and a semiconductor layer formed in a stack on a substrate. Each layer may in turn include more than one layer or film. For example, the semiconductor layer can include a first film including a semiconductor window layer, such as a cadmium sulfide layer, formed on the buffer layer and a second film including a semiconductor absorber layer, such as a cadmium telluride layer formed on the semiconductor window layer. Additionally, each layer can cover all or a portion of the device and/or all or a portion of the layer or substrate underlying the layer. For example, a "layer" can include any amount of any material that contacts all or a portion of a surface. In order to electrically connect a photovoltaic device, the back contact layer can include metal. For cadmium telluride (CdTe) solar cells, the presence of carbon residue and oxide on the cadmium telluride surface before forming metal back contact can affect the photovoltaic device performance.

A photovoltaic device can include a transparent conductive oxide layer adjacent to a substrate and layers of semiconductor material. The layers of semiconductor material can include a bi-layer, which may include an n-type semiconductor window layer, and a p-type semiconductor absorber layer. The n-type window layer and the p-type absorber layer may be positioned in contact with one another to create an electric field. Photons can free electron-hole pairs upon making contact with the n-type window layer, sending electrons to the n side and holes to the p side. Electrons can flow back to the p side via an external current path. The resulting electron flow provides current which, combined with the resulting voltage from the electric field, creates power. The result is the conversion of photon energy into electric power.

Cadmium telluride has been a desired material for solar cell absorber layer because of its optimal band structure and low cost manufacturing. In order to electrically connect a photovoltaic device, the back contact layer can include metal. For cadmium telluride solar cells, the back contact composition is critical to device performance. The surface of the cadmium telluride absorber layer can be prepared prior to forming a metal back contact adjacent to the cadmium telluride layer. However, during device manufacture, solar cells can absorb carbon-based material from the plant environment. The device surfaces can also become oxidized. This will change the composition of the back contact. As a result, the presence of carbon residue and oxide on the cadmium telluride surface before forming metal back contact can affect the photovoltaic device performance. A method of cleaning cadmium telluride surface before forming metal back contact can be developed to address this problem.

The method of cleaning a cadmium telluride surface can include contacting a cleaning agent with the cadmium telluride surface. In one aspect, carbon or oxygen can be removed from a semiconductor surface before forming a metal back contact adjacent to the photovoltaic device layer. The carbon can be a carbon residue. The carbon can be a carbon layer adjacent to the photovoltaic device layer. The photovoltaic device layer can be the window layer. The photovoltaic device layer can include cadmium telluride. The carbon or carbon-containing material can be removed by contacting a cleaning agent to a portion of the carbon or carbon-containing material. The cleaning agent can be contacted to the carbon or carbon-containing material in a location adjacent to the photovoltaic device layer.

In another aspect, a process for manufacturing a photovoltaic device can include forming a transparent conductive oxide layer adjacent to a substrate, forming a semiconductor window layer adjacent to the transparent conductive oxide layer, forming a semiconductor absorber layer adjacent to the semiconductor window layer, wherein the semiconductor absorber layer comprises cadmium telluride and a carbon-containing material. The process can further include contacting a cleaning agent to the carbon-containing material. The step of contacting a cleaning agent to the carbon-containing material can remove a portion of the carbon-containing material from the absorber layer. The absorber layer can have a carbon-containing layer and the step of contacting a cleaning agent with the absorber layer surface can alter the thickness of the carbon-containing material. After the carbon or carbon-containing material is removed, the thickness of an oxide layer can be adjusted before forming a back contact layer adjacent to the absorber layer surface.

The cleaning agent can include an acidic solution. The acidic solution can have a pH value in the range of about 3 to about 5. The acidic solution can include an organic acid. The acidic solution can include an acid such as aspartic acid, citric acid, gluconic acid, glutamic acid, maleic acid, oxalic acid, propionic acid, salicylic acid, and tartaric acid, or combinations of these acids, or any other suitable acid.

The cleaning agent can include an alkaline solution. The alkaline solution can have a pH value higher than about 9. The pH value of the alkaline solution can be adjusted by an amine compound. Examples of such amine compounds include ethylene diamine, tetra-alkyl ammonium salt, isopropanolamine, or isopropylhydroxylamine.

The cleaning agent can include a surfactant. For example, the surfactant can include a cationic surfactant, an anionic surfactant or a nonionic surfactant.

The cleaning agent can include a chelating agent. The chelating agent can be any suitable ion-binding material.

Examples of chelating agents that can be used include ethylene diamine, gluconic acid, isopropanolamine, isopropylhydroxylamine, dicarboxymethylglutamic acid, ethylenediamine-N,N'-disuccinic acid, or ethylenediaminetetraacetic acid.

The cleaning agent can include any suitable oxidizing material. For example, the cleaning agent can include ferric ammonium citrate, ferric chloride, ferric nitrate, ammonium cerium nitrate, N-bromosuccinamide, copper chlorate, pyridinium tribromide, or trifluoro-peracetic acid.

Contacting the cleaning agent to the carbon-containing material can include a dry process, for example, a process in the absence of water or other solvent. The dry process can include a reactive ion etch process. The dry process can include a plasma enhanced etch process with a reactive gas. The dry process can include a reactive ion etch process. The dry process can include a plasma enhanced etch process with a reactive gas. The reactive gas can include a reducing gas, oxidizing gas or any suitable gas. The reactive gas can include hydrogen.

The process of removing the carbon or carbon-containing material from the photovoltaic device layer can further include the step of removing oxide from the device layer surface, prior to forming the back contact.

The process of removing the carbon or carbon-containing material from the photovoltaic device layer can further include a material deposition step with a reactive gas. The deposited material can include carbon, carbon-containing species, or any other suitable material. The deposition process can be a plasma enhanced chemical vapor deposition (PECVD) or any other suitable deposition technique or chemical vapor deposition technique. The back contact can be oxidized, reduced, or material deposited with a reactive gas.

The process of manufacturing a photovoltaic device can further include a step of adjusting the thickness of an oxide layer after contacting a cleaning agent to the carbon-containing material.

The process of manufacturing a photovoltaic device can further include a step of adjusting the cadmium telluride ratio on the back contact surface. The back contact can include a metal and a metal oxide. The process of manufacturing a photovoltaic device can further include a step of adjusting the metal to metal oxide ratio in the back contact.

In another aspect, a multilayer structure can include a substrate, a transparent conductive oxide layer adjacent to the substrate, a semiconductor window layer including cadmium sulfide adjacent to the transparent conductive oxide layer, a semiconductor absorber layer including cadmium telluride and a carbon-containing material adjacent to the semiconductor window layer, and a cleaning agent adjacent to the semiconductor absorber layer.

Referring to FIG. 1, photovoltaic device 100 can include transparent conductive oxide layer 120 deposited adjacent to a substrate 110. Transparent conductive oxide layer 120 can be deposited on substrate 110 by sputtering or evaporation or any other appropriate method. Substrate 110 can include any suitable substrate material, including glass, such as soda-lime glass. Transparent conductive oxide layer 120 can include any suitable transparent conductive oxide material, including a cadmium stannate, an indium-doped cadmium oxide, or a tin-doped indium oxide. Semiconductor window layer 130 can be deposited adjacent to transparent conductive oxide layer 120. Semiconductor window layer 130 can be deposited adjacent to transparent conductive oxide layer 120, which can be annealed. Semiconductor window layer 130 can include any suitable window material, such as cadmium sulfide, and can be formed by any suitable deposition method, such as sputtering or vapor transport deposition. Semiconductor absorber layer 140 can be deposited adjacent to semiconductor window layer 130. Cadmium telluride absorber layer 140 can be deposited on semiconductor window layer 130. Cadmium telluride absorber layer 140 can have surface 141 facing up. During manufacture, solar cells can absorb carbon-based material from the plant environment and slowly air oxidizes. All these factors can result in presence of carbon residue and oxide 150 on cadmium telluride surface 141 before forming metal back contact.

Cadmium telluride surface 141 can be treated so oxides and carbon residues are removed. This can be accomplished with a chemical treatment that is oxidizing in an acidic or alkaline solution. In some embodiments, the acidic solutions can have pH value in the range of about 3.0 to about 5.0. The acidity can be adjusted using weak organic acids such as aspartic acid, benzoic acid, citric acid, gluconic acid, glutamic acidmaleic acid, oxalic acid, propionic acid, salicylic acid, tartaric acid, or any suitable mixtures of these acids. In some embodiments, the alkaline solutions can have pH value higher than about 9.0. The pH value can be adjusted with any number of amine compounds such as ethylene diamine, tetra-alkyl ammonium salts, isopropanolamine, isopropylhydroxylamine, or any suitable mixtures of these compounds.

The chemical treatment can include a cleaning agent which can be contacted to the carbon reside 150, adjacent to a photovoltaic device layer. The cleaning agent can be contacted to carbon residue 150 adjacent to semiconductor absorber layer 140. The cleaning agent may contain surfactants to aid in the removal of larger particles on cadmium telluride surface 141. The surfactants can include cationic, anionic, or nonionic surfactants.

The cleaning agent or solution which can be contacted to the carbon adjacent to semiconductor absorber layer 140 may contain chelating agents which selectively bind Cd or Te. Examples of chelating agents include compounds such as ethylene diamine, gluconic acid, isopropanolamine, isopropylhydroxylamine, dicarboxymethylglutamic acid, ethylenediamine-N,N'-disuccinic acid (EDDS), ethylenediaminetetraacetic acid (EDTA), or any other suitable chelating agent. Cleaning agents can include ferric ammonium citrate, ferric chloride, ferric nitrate, ammonium cerium nitrate, N-bromosuccinamide, copper chlorate, pyridinium tribromide, trifluoro-peracetic acid, or any other suitable oxidizing agent.

In some embodiments, the oxides and carbon residues can be removed through a dry process. The dry process can include reactive ion etching (RIE), vapor phase etching, or other suitable dry etch process.

Figure 2:
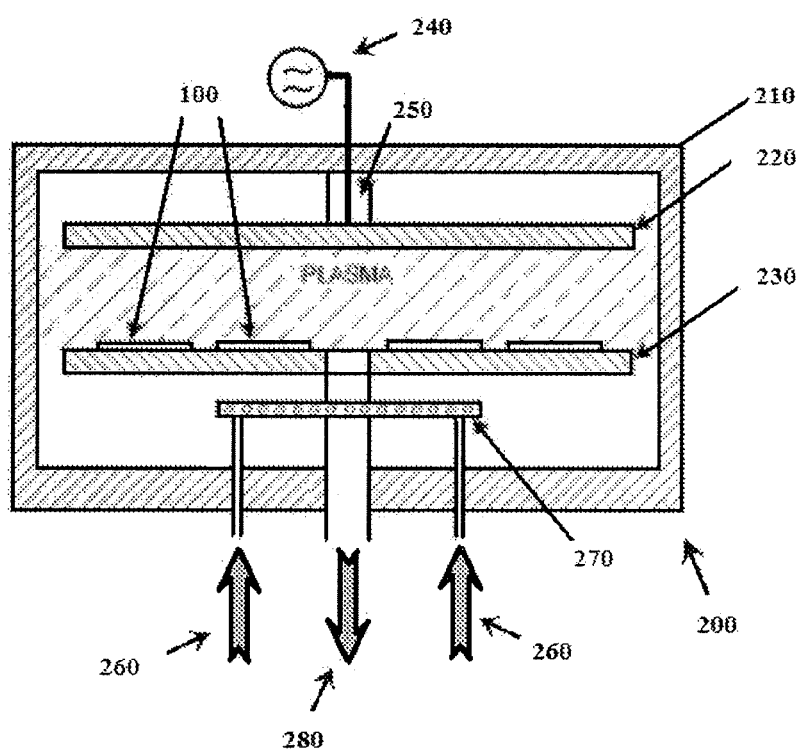
FIG. 2 is a schematic showing the reactive ion etch process of preparing cadmium telluride surface.

Referring to FIG. 2, in some embodiments, for a reactive ion etch process of preparing cadmium telluride surface in RIE system 200, photovoltaic device 100 can be placed inside reactor chamber 210 with cadmium telluride surface 141 (FIG. 1) facing up, wherein one or more gases 260 are introduced into reactor chamber 210 via diffuser nozzle 270. Upper electrode 220 and lower electrode 230 can be positioned oppositely in chamber 210. Lower electrode 230 can also used to hold photovoltaic device 100. A plasma is struck in the gas mixture using RF power source 240, breaking the gas molecules into ions. RF insulator 250 can be included in the chamber wall to isolate RF input. The ions can be accelerated towards, and reacts at, the surface of the material being etched, forming another gaseous material 280 that can be pumped out. This is known as the chemical part of reactive ion etching. There is also a physical part which is similar in nature to the sputtering deposition process. If the ions have high enough energy, they can knock carbon and oxide out of cadmium telluride surface 141 (FIG. 1) to be etched without a chemical reaction. It can be a complex task to develop a dry etch process that balances chemical and physical etching, since there are many parameters to adjust. By changing the balance it is possible to influence the resulting composition and roughness of the cleaned cadmium telluride surface 141 (FIG. 1).

Vapor phase etching can also be a dry etching solution, which can be done with simpler equipment than what RIE requires. In this process photovoltaic device 100 can be placed inside a chamber to be etched, in which one or more gases are introduced. The material to be etched is dissolved at the surface in a chemical reaction with the gas molecules. In some embodiments, the oxides and carbon residues can be removed through a plasma enhanced dry process with reactive gases such as hydrogen.

As discussed, the treatment can be a wet treatment, dry etch process, or any suitable combination of both. In some embodiments, the treatment can be used to erase any compositional changes caused by previous processing steps. In this manner, all carbon residue can be removed. Furthermore, the Cd/Te ratio and the metal oxide layer thickness can be adjusted to control the back contact composition.

Figure 3:
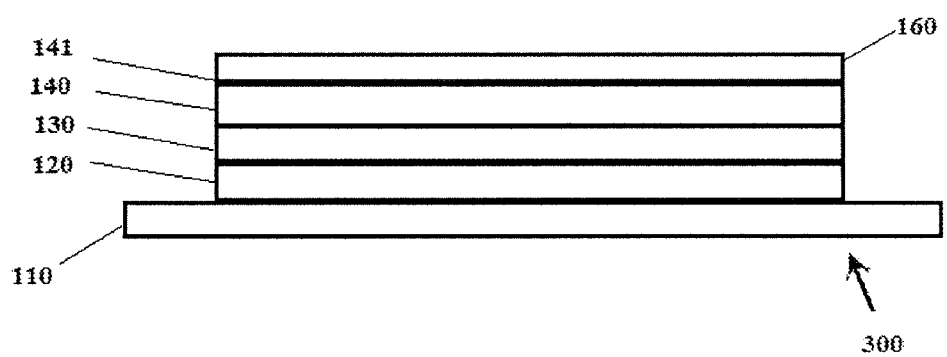
FIG. 3 is a schematic of a photovoltaic device having multiple layers with a metal back contact.

Referring to FIG. 3, after the steps of preparing cadmium telluride surface and forming metal back contact on cadmium telluride surface 141, a photovoltaic device 300 can include a transparent conductive oxide layer 120 deposited adjacent to a substrate 110. Transparent conductive oxide layer 120 can be deposited on substrate 110 by sputtering or evaporation or any other appropriate method. Substrate 110 can include any suitable substrate material, including glass, such as soda-lime glass. Transparent conductive oxide layer 120 can include any suitable transparent conductive oxide material, including a cadmium stannate, an indium-doped cadmium oxide, or a tin-doped indium oxide. Semiconductor window layer 130 can be deposited adjacent to transparent conductive oxide layer 120. Semiconductor window layer 130 can be deposited adjacent to transparent conductive oxide layer 120, which can be annealed. Semiconductor window layer 130 can include any suitable window material, such as cadmium sulfide, and can be formed by any suitable deposition method, such as sputtering or vapor transport deposition. Cadmium telluride absorber layer 140 can be deposited adjacent to semiconductor window layer 130. Cadmium telluride absorber layer 140 can be formed by any suitable method, such as sputtering or vapor transport deposition. Back contact 160 can be formed adjacent to cadmium telluride absorber layer 140. Back contact 160 can be formed on treated surface 141 of cadmium telluride absorber layer 140. In order to electrically connect a photovoltaic device, back contact 160 can include any suitable metal, such as molybdenum or copper.

In certain embodiments, a photovoltaic device can have a back contact layer which includes a back contact material to have better performance. The back contact material can include any suitable material. For example, the back contact material can include any other suitable material such as tellurium, selenium, calcium, lead, mercury or graphite.

A number of embodiments of the invention have been described. Nevertheless, it will be understood that various modifications may be made without departing from the spirit and scope of the invention. It should also be understood that the appended drawings are not necessarily to scale, presenting a somewhat simplified representation of various preferred features illustrative of the basic principles of the invention.

What is claimed is:

1. A method of manufacturing a photovoltaic device comprising the steps of: forming a transparent conductive oxide layer adjacent to a substrate; forming a semiconductor window layer adjacent to the transparent conductive oxide layer; forming a semiconductor absorber layer adjacent to the semiconductor window layer, wherein the semiconductor absorber layer comprises cadmium telluride and a carbon-containing material; contacting a cleaning agent to the carbon-containing material, thereby removing a portion of the carbon-containing material from the cadmium telluride layer; and forming a back contact layer adjacent to the absorber layer surface.

2. The method of claim 1, wherein the step of contacting a cleaning agent to the carbon-containing material alters the thickness of the carbon-containing material.

3. The method of claim 1, further comprising adjusting the thickness of an oxide layer after contacting a cleaning agent to the carbon-containing material.

4. The method of claim 1, further comprising adjusting the cadmium telluride ratio on the back contact surface.

5. The method of claim 1, wherein the back contact comprises a metal and a metal oxide.

6. The method of claim 5, further comprising adjusting the metal to metal oxide ratio in the back contact.

7. The method of claim 1, wherein the cleaning agent comprises an acidic solution.

8. The method of claim 7, wherein the acidic solution has a pH value in the range of about 3 to about 5.

9. The method of claim 7, wherein the acidic solution comprises an organic acid.

10. The method of claim 7, wherein the acidic solution comprises an acid selected from the group consisting of aspartic acid, citric acid, gluconic acid, glutamic acid, maleic acid, oxalic acid, propionic acid, salicylic acid, and tartaric acid.

11. The method of claim 1, wherein the cleaning agent comprises an alkaline solution.

12. The method of claim 11, wherein the alkaline solution has a pH value higher than about 9.

13. The method of claim 11, wherein the pH value of the alkaline solution is adjusted by an amine compound.

14. The method of claim 13, wherein the amine compound is selected from the group consisting of ethylene diamine, tetra-alkyl ammonium salt, isopropanolamine, and isopropylhydroxylamine.

15. The method of claim 1, wherein the cleaning agent comprises a surfactant.

16. The method of claim 15, wherein the surfactant comprises a cationic surfactant.

17. The method of claim 15, wherein the surfactant comprises an anionic surfactant.

18. The method of claim 15, wherein the surfactant comprises a nonionic surfactant.

19. The method of claim 1, wherein the cleaning agent comprises a chelating agent.

20. The method of claim 19, wherein the chelating agent is selected from the group consisting of ethylene diamine, gluconic acid, isopropanolamine, isopropylhydroxylamine, dicarboxymethylglutamic acid, ethylenediamine-N,N'-disuccinic acid, and ethylenediaminetetraacetic acid.

21. The method of claim 1, wherein the cleaning agent comprises ferric ammonium citrate, ferric chloride, ferric nitrate, ammonium cerium nitrate, N-bromosuccinamide, copper chlorate, pyridinium tribromide, or trifluoro-peracetic acid.

* * * * *